US009673272B2

United States Patent
Choi et al.

(10) Patent No.: US 9,673,272 B2
(45) Date of Patent: Jun. 6, 2017

(54) SEMICONDUCTOR DEVICE INCLUDING CAPACITOR AND METHOD OF FABRICATING THE SAME

(71) Applicant: Samsung Electronics Co., Ltd., Suwon-si, Gyeonggi-do (KR)

(72) Inventors: Yunjung Choi, Seoul (KR); Se Hoon Oh, Hwaseong-si (KR); Jin-Su Lee, Hwaseong-si (KR); Younsoo Kim, Yongin-si (KR); HanJin Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/863,820

(22) Filed: Sep. 24, 2015

(65) Prior Publication Data

US 2016/0104763 A1 Apr. 14, 2016

(30) Foreign Application Priority Data

Oct. 14, 2014 (KR) .................. 10-2014-0138430

(51) Int. Cl.
*H01L 29/00* (2006.01)
*H01L 49/02* (2006.01)

(52) U.S. Cl.
CPC .............. *H01L 28/75* (2013.01); *H01L 28/90* (2013.01)

(58) Field of Classification Search
CPC ...................................... H01L 28/75

USPC .......................................... 257/532
See application file for complete search history.

(56) References Cited

U.S. PATENT DOCUMENTS

| | | | |
|---|---|---|---|
| 6,190,963 B1 | 2/2001 | Zhang et al. |
| 6,559,499 B1 | 5/2003 | Alers et al. |
| 6,746,916 B2 | 6/2004 | Agarwal et al. |
| 6,993,814 B2 | 2/2006 | Adler |
| 7,713,831 B2 | 5/2010 | Park et al. |
| 8,664,076 B2 | 3/2014 | Raghavan et al. |
| 2002/0071237 A1 | 6/2002 | Adler |
| 2003/0011016 A1 | 1/2003 | Agarwal et al. |
| 2008/0081430 A1 | 4/2008 | Park et al. |
| 2009/0273882 A1 | 11/2009 | Park et al. |
| 2012/0064690 A1 | 3/2012 | Hirota et al. |
| 2013/0069200 A1 | 3/2013 | Raghavan et al. |
| 2014/0103491 A1 | 4/2014 | Kim et al. |

FOREIGN PATENT DOCUMENTS

| | | |
|---|---|---|
| JP | H11261028 A | 9/1999 |
| JP | 2002198324 A | 7/2002 |
| JP | 2012080095 A | 4/2012 |
| KR | 100400846 B1 | 10/2003 |
| KR | 100811271 B1 | 3/2008 |
| KR | 101075527 B1 | 10/2011 |
| KR | 20140048654 A | 4/2014 |

*Primary Examiner* — David S Blum
(74) *Attorney, Agent, or Firm* — Harness, Dickey & Pierce, P.L.C.

(57) ABSTRACT

A semiconductor device includes a lower electrode on a lower structure, a dielectric layer conformally covering a surface of the lower electrode, an upper electrode conformally covering a surface of the dielectric layer, and a barrier layer on the upper electrode. The barrier layer and the upper electrode define a space on a sidewall of the lower electrode.

18 Claims, 14 Drawing Sheets

SEMICONDUCTOR DEVICE INCLUDING CAPACITOR AND METHOD OF FABRICATING THE SAME

CROSS-REFERENCE TO RELATED APPLICATION

This U.S. non-provisional patent application claims priority under 35 U.S.C. §119 to Korean Patent Application No. 10-2014-0138430, filed on Oct. 14, 2014, in the Korean Intellectual Property Office, the disclosure of which is hereby incorporated by reference in its entirety.

BACKGROUND

1. Field

Example embodiments of the inventive concepts relate to a semiconductor device including a capacitor and a method of fabricating the same. More particularly, example embodiments of the inventive concepts relate to a semiconductor device including capacitor with improved reliability and a method of fabricating the same.

2. Description of the Related Art

Capacitors having a sufficient capacitance in a limited area have been demanded as semiconductor devices have been highly integrated. The capacitance of the capacitor is proportional to a surface area of an electrode and a dielectric constant of a dielectric layer but is inversely proportional to an equivalent oxide thickness of the dielectric layer. Thus, to increase the capacitance of the capacitor in a limited area, a capacitor having a three-dimensional structure may be formed to increase the surface area of the electrode and/or the equivalent oxide thickness may be reduced. In addition, a high-k dielectric layer may be used in the capacitor to increase the capacitance. To increase the surface area of the electrode, a height of a lower (or storage) electrode may be increased and/or an effective surface area of the lower electrode may be increased by a hemi-spherical grain (HSG) technique. In addition, one cylindrical storage (OCS) electrode may be used to increase the surface area of the electrode. In other words, an outer surface and an inner surface of the OCS electrode may be used as the effective surface area of the electrode of the capacitor.

SUMMARY

Example embodiments of the inventive concepts may provide a semiconductor device including a capacitor with improved reliability and a method of fabricating the same.

According to example embodiments, a semiconductor device may include a lower electrode on a lower structure, a dielectric layer conformally covering a surface of the lower electrode, an upper electrode conformally covering a surface of the dielectric layer, and a barrier layer on the upper electrode. The barrier layer and the upper electrode may define a space on a sidewall of the lower electrode.

In example embodiments, the semiconductor device may further include a capping layer covering the barrier layer on the lower structure.

In example embodiments, the semiconductor device may further include a middle layer between the barrier layer and the capping layer. The middle layer may include a titanium-silicon nitride (TiSiN) layer.

In example embodiments, the upper electrode and the barrier layer may include a same material. The upper electrode may have a tensile stress, and the barrier layer may have a compressive stress.

In example embodiments, the barrier layer may be a titanium nitride layer.

In example embodiments, the semiconductor device may further include a support pattern on a portion of the sidewall of the lower electrode.

According to example embodiments, a semiconductor device may include a lower electrode on a lower structure, a first support pattern on one sidewall of the lower electrode, a dielectric layer conformally covering the lower electrode and the first support pattern, an upper electrode conformally covering the dielectric layer, and a barrier layer on the upper electrode to cover a top surface of the lower electrode. The first support pattern, the first sidewall of the lower electrode, and the lower structure may define a first space under the first support pattern and surrounded by the upper electrode.

In example embodiments, the lower electrode may include a first lower electrode part below the first support pattern, and a second lower electrode part above the first support pattern. The upper electrode may include a first upper electrode part covering the first lower electrode part, and a second upper electrode part covering the second lower electrode part.

In example embodiments, the barrier layer may contact a portion of the upper electrode covering a sidewall of the first support pattern and may extend onto a top surface of the lower structure.

In example embodiments, the first upper electrode part may include a first vertical portion covering a sidewall of the first lower electrode part, a first top portion under the first support pattern and a first bottom portion on the lower structure. The first vertical portion, the first top portion, the first bottom portion and the barrier layer may define a second space.

In example embodiments, the first support pattern, the second lower electrode part, and the barrier layer may define a third space on the first support pattern, and the upper electrode and the barrier layer surround the third space.

In example embodiments, the second upper electrode part may include a second vertical portion covering a sidewall of the second lower electrode part, a second top portion under the second support portion and a second bottom portion on the first support pattern, and the second vertical portion, the second top portion, the second bottom portion and the barrier layer may define the third space.

In example embodiments, a second sidewall of the lower electrode, the lower structure, and the barrier layer may define a fourth space on the lower structure, and the upper electrode and the barrier layer may surround the fourth space.

In example embodiments, the lower structure may include a cell region and a peripheral circuit region, the lower electrode, the dielectric layer, the upper electrode, and the barrier layer may be sequentially stacked on the lower structure of the cell region, and the barrier layer may extend onto the top surface of and may cover the lower structure of the peripheral circuit region.

In example embodiments, the upper electrode and the barrier layer may include a same material, the upper electrode may have a tensile stress, and the barrier layer may have a compressive stress.

According to example embodiments, a semiconductor device includes a lower electrode on a lower structure, a dielectric layer on the lower electrode, an upper electrode on the dielectric layer, and a barrier layer on the upper electrode, the barrier layer having an upper portion including titanium-silicon nitride (TiSiN).

In example embodiments, the device may further include a capping layer covering the barrier layer.

In example embodiments, the upper electrode and the barrier layer may include a same material, the upper electrode may have a tensile stress, and the barrier layer may have a compressive stress.

In example embodiments, a lower portion of the barrier layer may include titanium nitride.

In example embodiments, the device may further include a support pattern on a portion of a sidewall of the lower electrode.

BRIEF DESCRIPTION OF THE DRAWINGS

The inventive concepts will become more apparent in view of the attached drawings and accompanying detailed description.

DETAILED DESCRIPTION

Figure 1:
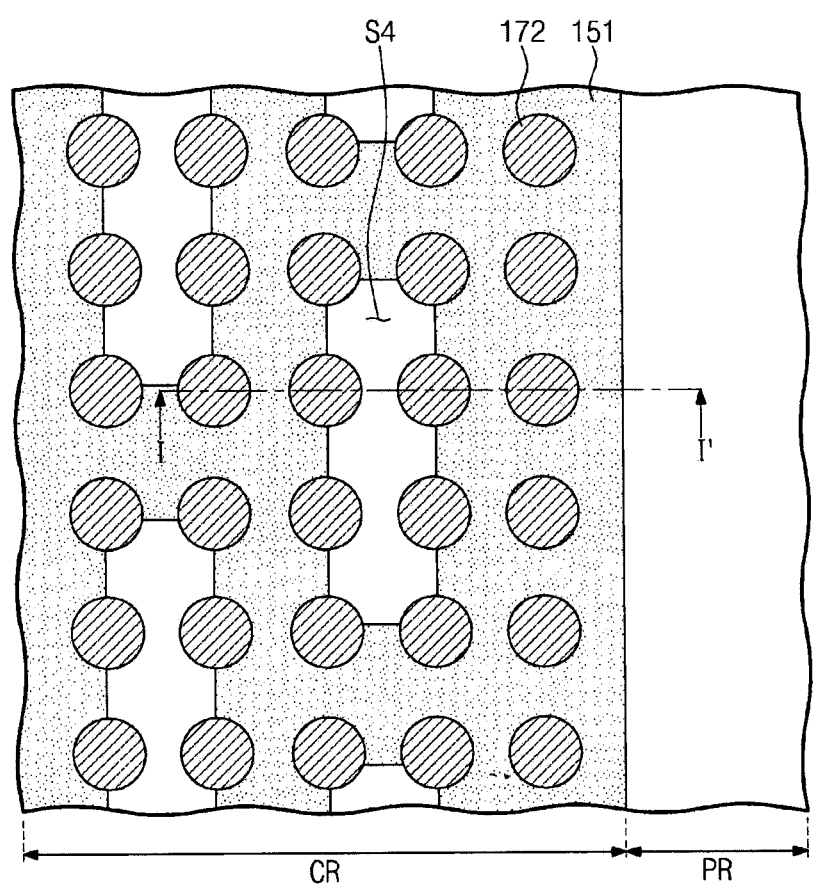
FIG. 1 is a plan view illustrating a semiconductor device including a capacitor according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, example embodiments of the inventive concepts are not limited to the specific examples provided herein and are exaggerated for clarity.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the example embodiments in the detailed description will be described with sectional views as ideal example views of the inventive concepts. Accordingly, shapes of the example views may be modified according to manufacturing techniques and/or allowable errors. Therefore, the example embodiments of the inventive concepts are not limited to the specific shape illustrated in the example views, but may include other shapes that may be created according to manufacturing processes. Areas illustrated in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in example embodiments could be termed a second element in other embodiments without departing from the teachings of the inventive concepts. Example embodiments of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
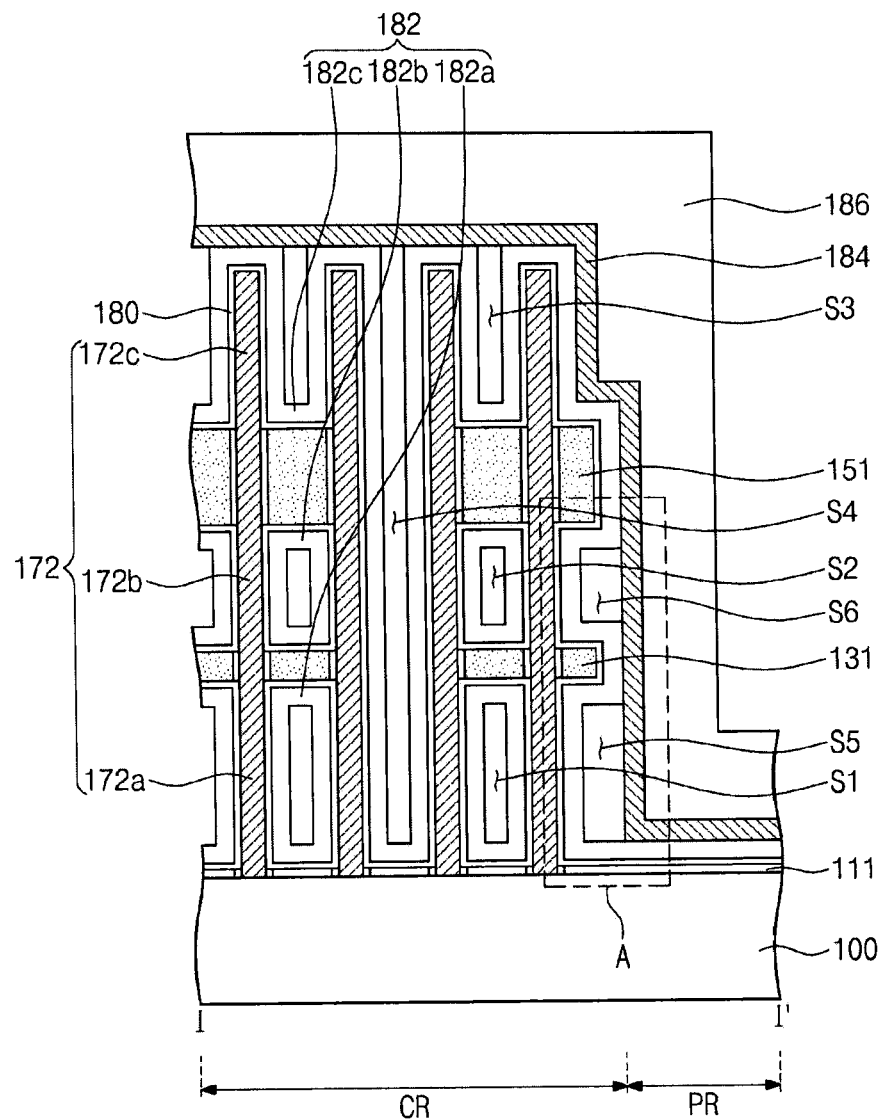
FIG. 2A is a cross-sectional view taken along line I-I' of FIG. 1 to illustrate a semiconductor device including a capacitor according to example embodiments of the inventive concepts.
Figure 2B:
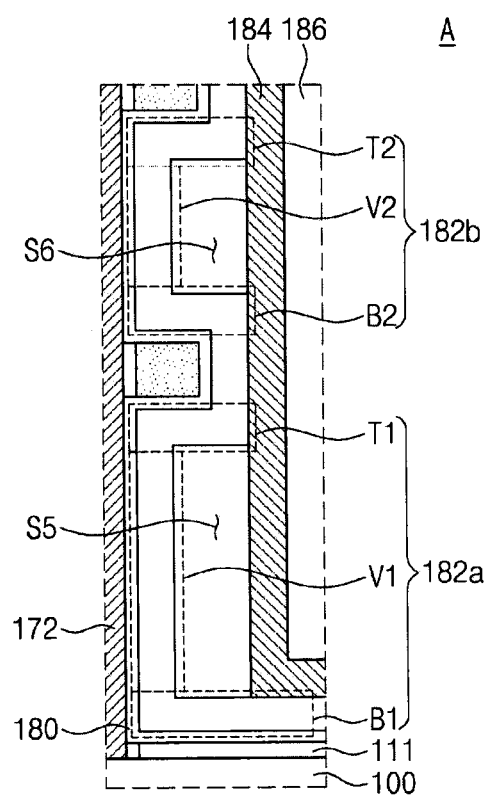
FIG. 2B is an enlarged view of portion 'A' of FIG. 2A to illustrate a semiconductor device including a capacitor according to example embodiments of the inventive concepts.

FIG. 1 is a plan view illustrating a semiconductor device including a capacitor according to embodiments of the inventive concepts. FIG. 2A is a cross-sectional view taken along line I-I' of FIG. 1 to illustrate a semiconductor device including a capacitor according to some embodiments of the inventive concepts. FIG. 2B is an enlarged view of portion 'A' of FIG. 2A to illustrate a semiconductor device including a capacitor according to some embodiments of the inventive concepts.

Referring to FIGS. 1 and 2A, a lower structure 100 may include a cell region CR and a peripheral circuit region PR. The cell region CR may be a region in which memory cells may be disposed, and the peripheral circuit region PR may be a region in which peripheral circuits controlling the memory cells may be disposed. Semiconductor components constituting the memory cells and the peripheral circuits may include, for example, metal-oxide-semiconductor (MOS) transistors, a diode, and/or a resistor. The lower structure 100 may include a semiconductor substrate (not shown), the semiconductor components (not shown) and interlayer insulating layers (not shown) on the semiconductor substrate. According to example embodiments, gate lines (not shown) and bit lines (not shown) may be formed on the lower structure 100 of the cell region CR. In addition, contact plugs connected to source, drain, and gate electrodes of the MOS transistor may also be formed on the lower structure 100 of the cell region CR. An uppermost layer of the lower structure 100 may consist of a planarized interlayer insulating layer.

A lower electrode 172 may be formed on the lower structure 100 of the cell region CR. The lower electrode 172 may be provided as a plurality of the lower electrodes. The plurality of lower electrodes 172 may be spaced apart from each other at equal intervals. The lower electrode 172 may include a pillar shape having a high aspect ratio. The lower electrode 172 may include a first lower electrode part 172a, a second lower electrode part 172b, and a third lower electrode part 172c. The lower electrode 172 may include at least one of a metal material, a metal nitride, or a metal silicide. In example embodiments, the lower electrode 172 may be formed of a refractory metal material, e.g., cobalt, titanium, nickel, tungsten, and/or molybdenum. In other embodiments, the lower electrode 172 may be formed of the metal nitride, e.g., titanium nitride (TiN), titanium-silicon nitride (TiSiN), titanium-aluminum nitride (TiAlN), tantalum nitride (TaN), tantalum-aluminum nitride (TaAlN), and/or tungsten nitride (WN). In still other embodiments, the lower electrode 172 may be formed of a noble metal, e.g., platinum (Pt), ruthenium (Ru), and/or iridium (Ir). In yet other example embodiments, the lower electrode 172 may be formed of at least one of a noble metal conductive oxide (e.g., PtO, $RuO_2$, and/or $IrO_2$) and a conductive oxide (e.g., $SrRuO_3$ (SRO), $(Ba,Sr)RuO_3$ (BSRO), $CaRuO_3$ (CRO), and/or LSCo).

An etch stop pattern 111 may cover a top surface of the lower structure 100. The lower electrodes 172 may penetrate the etch stop pattern 111. For example, the etch stop pattern 111 may include silicon nitride (SiN) or silicon oxynitride (SiON).

A first support pattern 131 may cover a portion of a sidewall of the lower electrode 172. The first support pattern 131 may be in contact with a portion of a sidewall of a lower region of the lower electrode 172. In addition, the first support pattern 131 may also be in contact with portions of sidewalls of other neighboring lower electrodes 172. Thus, the first support pattern 131 may support the lower regions of the lower electrodes 172 adjacent to each other. A portion of the lower electrode 172 below the first support pattern 131 may correspond to the first lower electrode part 172a. The lower structure 100, the first lower electrode part 172a, and the first support pattern 131 may define a first space S1. The first space S1 may be under the first support pattern 131.

A second support pattern 151 may be spaced apart from the first support pattern 131 and may cover a portion of the sidewall of the lower electrode 172. The second support pattern 151 may be in contact with a portion of a sidewall of an upper region of the lower electrode 172. In addition, the second support pattern 151 may also be in contact with portions of sidewalls of other neighboring lower electrodes 172. Thus, the second support pattern 151 may support the upper regions of the lower electrodes 172 adjacent to each other. A portion of the lower electrode 172 between the first and second support patterns 131 and 151 may correspond to the second lower electrode part 172b. The first support pattern 131, the second support pattern 151, and the second lower electrode part 172b may define a second space S2. The second space S2 may be disposed between the first support pattern 131 and the second support pattern 151.

The second support pattern 151 may expose a portion of the upper region of the lower electrode 172. A portion of the lower electrode 172 above the second support pattern 151 may correspond to the third lower electrode part 172c.

A dielectric layer 180 may be disposed on the lower structure 100. In more detail, the dielectric layer 180 may conformally cover a top surface of the etch stop pattern 111, a surface of the lower electrode 172, and surfaces of the first and second support patterns 131 and 151. Thus, the first and second spaces S1 and S2 may be surrounded by the dielectric layer 180.

The dielectric layer 180 may be formed of a single or multi-layer. The dielectric layer 180 may include at least one of a metal oxide (e.g., $HfO_2$, $ZrO_2$, $Al_2O_3$, $La_2O_3$, $Ta_2O_3$, and/or $TiO_2$) and a perovskite-based dielectric material (e.g., $SrTiO_3$ (STO), $(Ba,Sr)TiO_3$ (BST), $BaTiO_3$, PZT, and/or PLZT). A thickness of the dielectric layer 180 may be in a range of about 50 Å to about 150 Å.

An upper electrode 182 may be disposed on the dielectric layer 180. In detail, the upper electrode 182 may be conformally formed on the dielectric layer 180. Thus, the upper electrode 182 may conformally cover the top surface of the etch stop pattern 111, the surface of the lower electrode 172, and the surfaces of the first and second support patterns 131 and 151.

In more detail, the upper electrode 182 may include a first upper electrode part 182a, a second upper electrode part 182b, and a third upper electrode part 182c. The first upper electrode part 182a may be formed under the first support pattern 131 to cover the lower structure 100, the first support pattern 131, and the first lower electrode part 172a. The second upper electrode part 182b may be formed between the first support pattern 131 and the second support pattern 151 to cover the second lower electrode part 172b and the first and second support patterns 131 and 151. The third upper electrode part 182c may be formed on the second support pattern 151 to cover the third lower electrode part 172c and the second support pattern 151. Thus, the first space S1 may be surrounded by the first upper electrode 182a, and the second space S2 may be surrounded by the second upper electrode 182b.

A third space S3 may be on the second support pattern 151. The third space S3 may be defined by the third lower electrode part 172c, the second support pattern 151, and a barrier layer 184. The third space S3 may be surrounded by the third upper electrode 182c and the barrier layer 184.

For example, the upper electrode 182 may include at least one of a semiconductor material doped with dopants, a metal material, a metal nitride, and/or a metal silicide. For example, the upper electrode 182 may include at least one of a refractory metal (e.g., cobalt, titanium, nickel, tungsten, and/or molybdenum), a metal nitride (e.g., titanium nitride (TiN), titanium-aluminum nitride (TiAlN), and/or tungsten nitride (WN)), and/or a noble metal (e.g., platinum (Pt), ruthenium (Ru), and/or iridium (Ir)). The upper electrode 182 may have a tensile stress characteristic.

The barrier layer 184 may be disposed on the upper electrode 182. In detail, the barrier layer 184 may be in contact with the upper electrode 182 which covers a top surface of the lower electrode 172 and sidewalls of the first and second support patterns 131 and 151 adjacent to the peripheral circuit region PR. The barrier layer 184 may extend onto the top surface of the lower structure 100 so as to be disposed on the lower structure 100 of the peripheral circuit region PR.

The barrier layer 184 may not be provided into the first and second spacers S1 and S2. Thus, the barrier layer 184 may be spaced apart from the first upper electrode 182a surrounding the first space S1 and the second upper electrode 182b surrounding the second space S2.

A fourth space S4 penetrating the first and second support patterns 131 and 151 may be provided on the lower structure 100. The fourth space S4 may be defined by the barrier layer 184 and the upper electrode 182 formed on the lower structure 100 and the lower electrode 172. The fourth space S4 may be surrounded by the upper electrode 182 and the barrier layer 184.

Referring to FIGS. 2A and 2B, a fifth space S5 and a sixth space S6 may be provided on the lower structure 100 of the cell region CR adjacent to the peripheral circuit region PR. The fifth space S5 may be surrounded by the first upper electrode part 182a and the barrier layer 184. The first upper electrode part 182a surrounding the fifth space S5 may include a first top portion T1 disposed on a bottom surface of the first support pattern 131, a first vertical portion V1 disposed on the sidewall of the first lower electrode 172a, and a first bottom portion B1 disposed on the top surface of the lower structure 100. The first vertical portion V1 of the first upper electrode part 182a may be spaced apart from the barrier layer 184 with the fifth space S5 interposed therebetween.

The sixth space S6 may be surrounded by the second upper electrode part 182b and the barrier layer 184. The second upper electrode part 182b surrounding the sixth space S6 may include a second top portion T2 disposed on a bottom surface of the second support pattern 151, a second vertical portion V2 disposed on the sidewall of the second lower electrode part 172b, and a second bottom portion B2 disposed on a top surface of the first support pattern 131. The second vertical portion V2 of the second upper electrode part 182b may be spaced apart from the barrier layer 184 with the sixth space S6 interposed therebetween.

The first space S1, the second space S2, the third space S3, the fourth space S4, the fifth space S5, and the sixth space S6 may be connected to each other.

Referring again to FIGS. 1 and 2A, the barrier layer 184 may be formed by, for example, a physical vapor deposition (PVD) process. The barrier layer 184 may be formed of the same material as the upper electrode 182. For example, the barrier layer 184 may include a metal nitride layer (e.g., a titanium nitride (TiN) layer). In example embodiments, the barrier layer 184 may include at least one of titanium (Ti), tungsten (W), tungsten nitride (WN), ruthenium (Ru), molybdenum nitride (MoN), aluminum nitride (AlN), an/or tantalum nitride (TaN). The barrier layer 184 may have a compressive stress characteristic.

A capping layer 186 may be formed on the lower structure 100 to cover the barrier layer 184. The capping layer 186 may cover a top surface of the barrier layer 184 disposed on the lower structure 100. For example, the capping layer 186 may be formed of silicon-germanium (SiGe) doped with dopants. The dopants may be, for example, boron (B). The boron (B) may reduce a resistance value of the capping layer 186 and may increase a crystallization degree of silicon.

A metal contact (not shown) may be provided on the capping layer 186 to be in contact with the capping layer 186.

Figure 3:
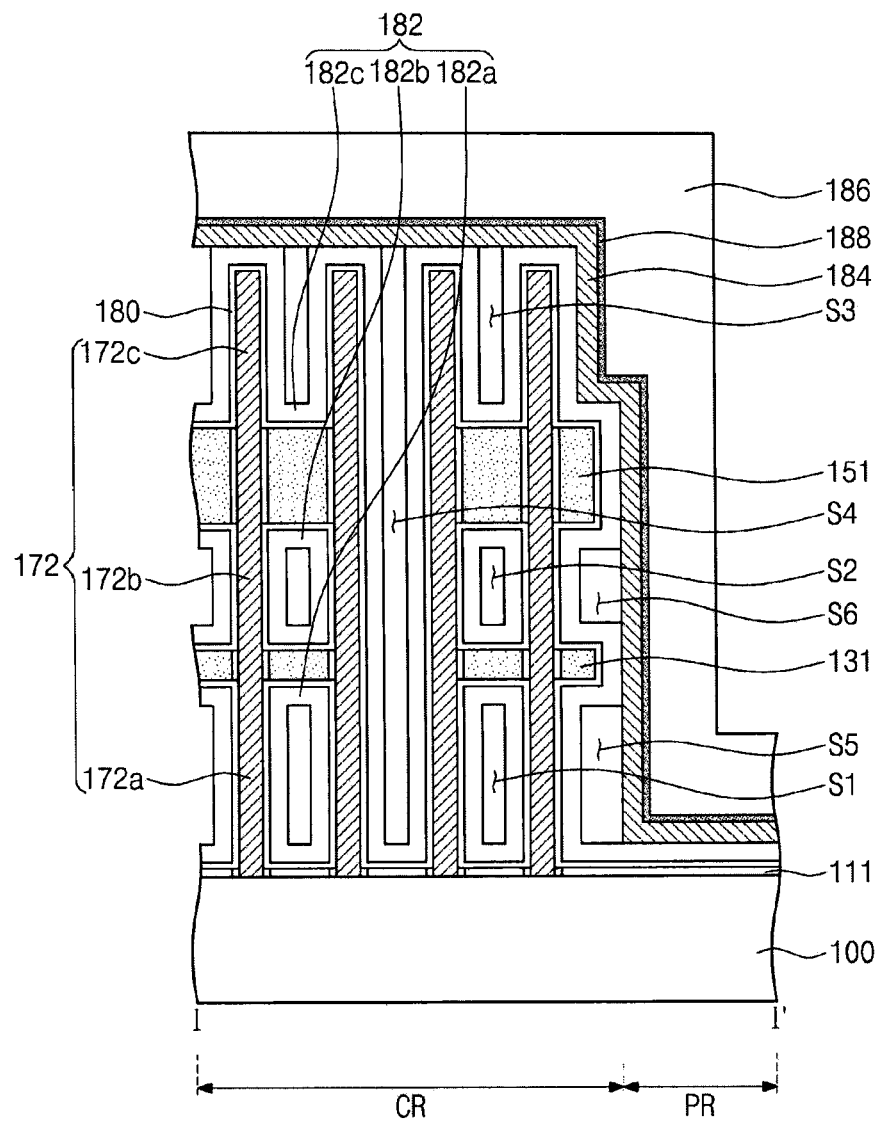
FIG. 3 is a cross-sectional view taken along line I-I' of FIG. 1 to illustrate a semiconductor device including a capacitor according to example embodiments of the inventive concepts.

FIG. 3 is a cross-sectional view taken along line I-I' of FIG. 1 to illustrate a semiconductor device including a capacitor according to example embodiments of the inventive concepts. In example embodiments, the same elements as described in the above embodiments will be indicated by the same reference numerals or the same designators. For the purpose of ease and convenience in explanation, the descriptions to the same elements as described in the above embodiment will be omitted or mentioned briefly.

Referring to FIG. 3, a middle layer 188 may be disposed between the barrier layer 184 and the capping layer 186. Silicon atoms included in a source gas used for depositing the capping layer 186 may react with an interface of the barrier layer 184 to form the middle layer 188. Thus, a portion of an upper portion of the barrier layer 184 may be converted into the middle layer 188. The middle layer 188 may correspond to a compound formed by reacting the barrier layer 184 with silicon atoms. For example, the middle layer 188 may be a TiSiN layer. The middle layer 188 may be spaced apart from the upper electrode 182.

FIGS. 4A to 4H are cross-sectional views taken along a line I-I' of FIG. 1 to illustrate a method of fabricating a semiconductor device including a capacitor according to example embodiments of the inventive concepts.

Figure 4A:
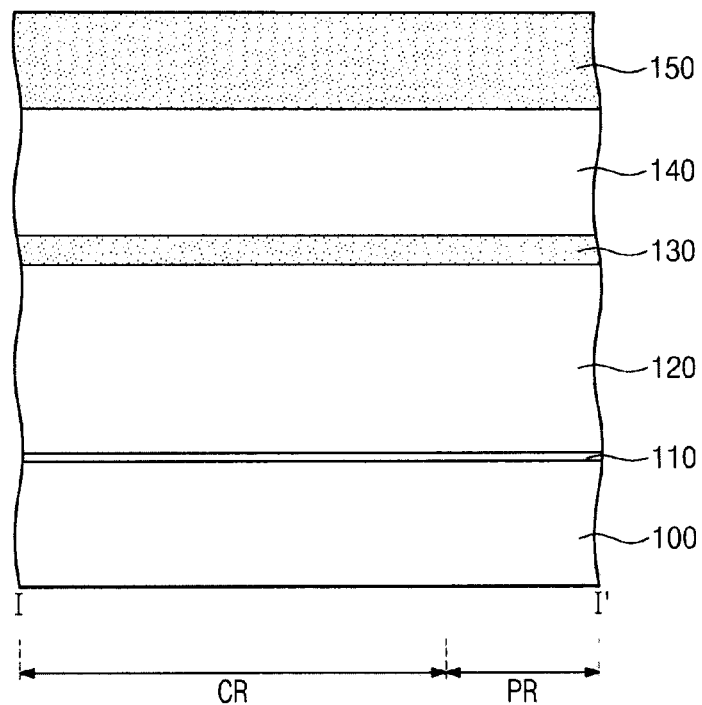
FIGS. 4A to 4H are cross-sectional views taken along line I-I' of FIG. 1 to illustrate a method of fabricating a semiconductor device including a capacitor according to example embodiments of the inventive concepts.

Referring to FIG. 4A, a lower structure 100 may be prepared. The lower structure 100 may include a semiconductor substrate, semiconductor components, and interlayer insulating layers. In more detail, the lower structure 100 may include a cell region CR in which memory cells are disposed, and a peripheral circuit region PR in which peripheral circuits controlling the memory cells are disposed. The semiconductor components constituting the memory cell and the peripheral circuit may include, for example, MOS transistors, a diode, and a resistor. According to example embodiments, gate lines (not shown) and bit lines (not shown) may be formed on the lower structure 100 of the cell region CR. In addition, contact plugs connected to source, drain, and gate electrodes of the MOS transistor may also be formed on the lower structure 100 of the cell region CR.

An uppermost layer of the lower structure 100 may consist of a planarized interlayer insulating layer. The interlayer insulating layers of the lower structure 100 may include at least one of a high-density plasma (HDP) oxide layer, a tetraethylorthosilicate (TEOS) layer, a plasma-enhanced tetraethylorthosilicate (PE-TEOS) layer, an O3-tetraethylorthosilicate (O3-TEOS) layer, a undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin-on-glass (SOG) layer, and/or a Tonen SilaZene (TOSZ) layer. In addition, the interlayer insulating layers may include or may further include at least one of a silicon nitride layer, a silicon oxynitride layer, and/or a low-k dielectric layer having a low dielectric constant.

A mold structure may be formed on the lower structure 100. The mold structure may include an etch stop layer 110, a first mold layer 120, a first support layer 130, a second mold layer 140, and a second support layer 150 which are sequentially stacked on the lower structure 100. Each of the first and second mold layers 120 and 140 may include, for example, a silicon oxide ($SiO_2$) layer or an oxide layer including germanium (Ge). The first mold layer 120 may be thicker than the second mold layer 140. Each of the first and second mold layers 120 and 140 may be formed using a deposition process, e.g., a chemical vapor deposition (CVD) process or a physical vapor deposition (PVD) process.

The etch stop layer 110 may be formed of an insulating material having an etch selectivity with respect to the lower structure 100 and the first mold layer 120. For example, the etch stop layer 110 may be formed of a silicon nitride layer (SiN) layer or a silicon oxynitride (SiON) layer.

The first and second support layers 130 and 150 may be formed of an insulating material having an etch selectivity with respect to the first and second mold layers 120 and 140. For example, each of the first and second support layers 130 and 150 may be formed of a silicon nitride (SiN) layer or a silicon carbon-nitride (SiCN) layer. The second support layer 150 may be thicker than the first support layer 130.

Figure 4B:
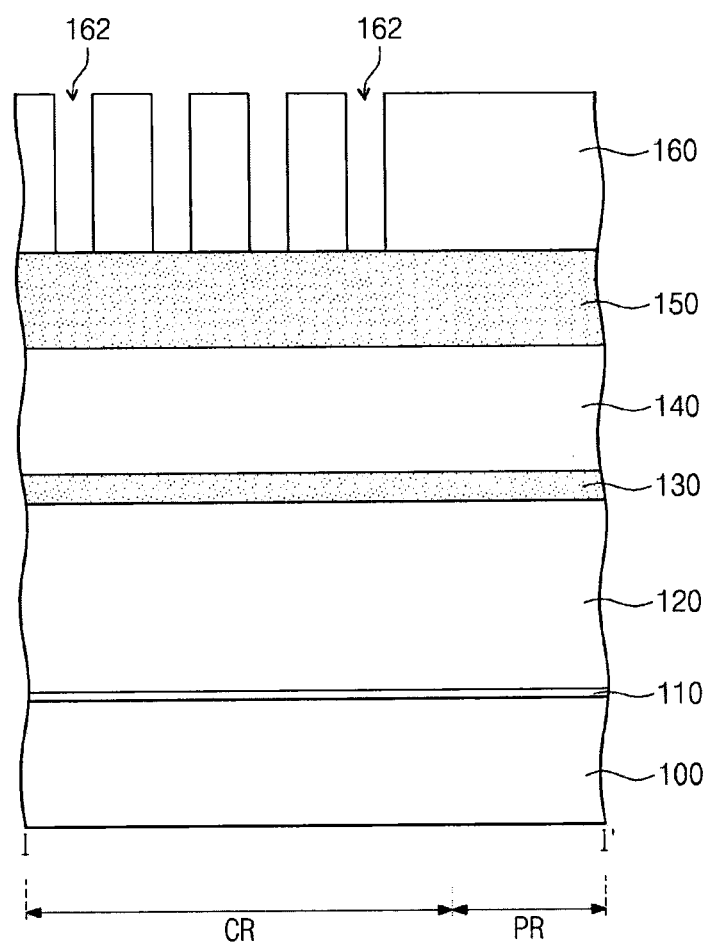

Referring to FIG. 4B, a mask structure 160 may be formed on the second support layer 150. The mask structure 160 may include openings 162. The opening 162 may be formed in the cell region CR. Thus, the opening 162 may expose a portion of the second support layer 150 in the cell region CR. The mask structure 160 may include a hard mask pattern and an organic mask pattern which are sequentially stacked on the second support layer 150. The hard mask pattern may be formed of at least one of a poly-silicon layer and an oxide layer. The organic mask pattern may be formed of a spin-on-hard mask (SOH) layer or an amorphous carbon layer (ACL).

Figure 4C:
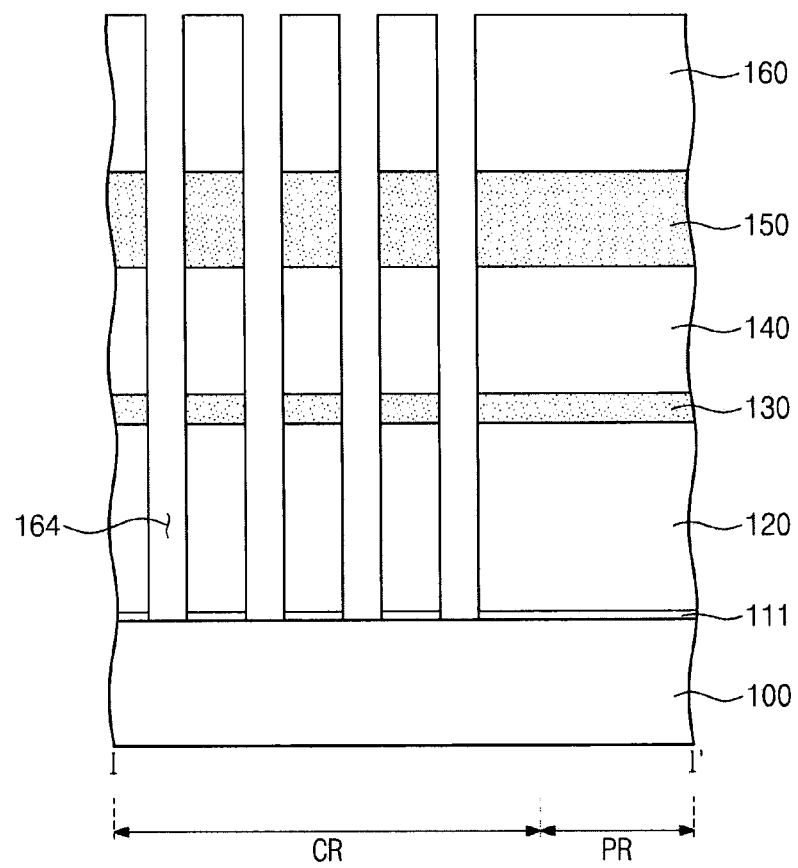

Referring to FIG. 4C, the mold structure may be anisotropically etched using the mask structure 160 as an etch mask to form lower electrode holes 164. In other words, the second support layer 150, the second mold layer 140, the first support layer 130, and the first mold layer under the opening 162 may be sequentially etched to form the lower electrode hole 164.

A difference between an etch rate of the first and second mold layers 120 and 140 and an etch rate of the first and second support layers 130 and 150 may be 10% or less during the anisotropic etching process for forming the lower electrode hole 164. In addition, the anisotropic etching process for forming the lower electrode hole 164 may use an etch gas etching the first and second mold layers 120 and 140 and an etch gas etching the first and second supporting layers 130 and 150. The etch stop layer 110 may be recessed during the formation of the lower electrode hole 164, so an etch stop pattern 111 may be formed.

Figure 4D:
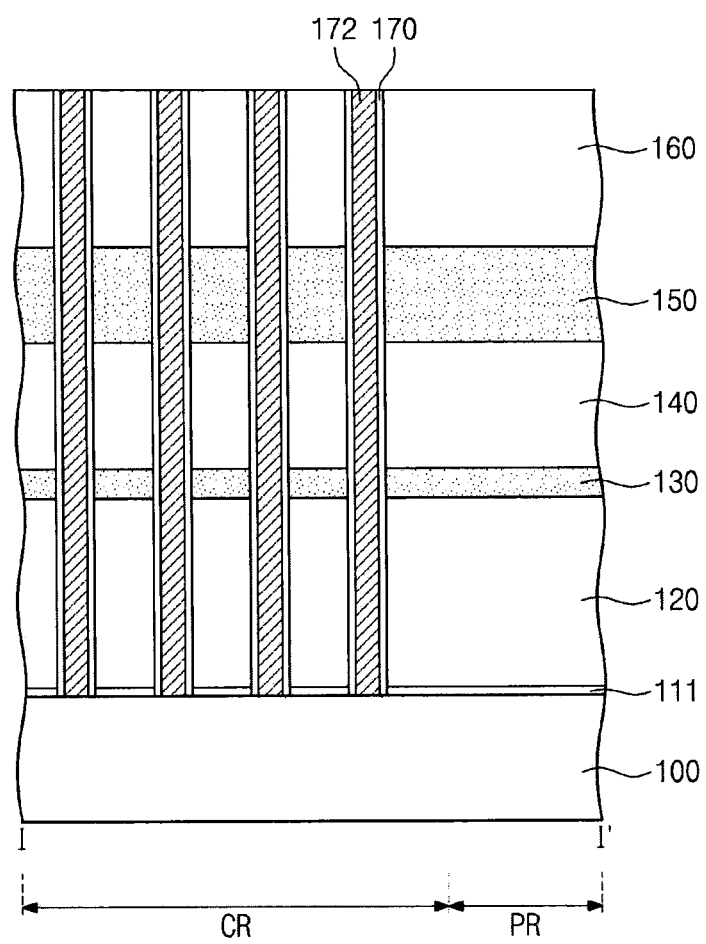

Referring to FIG. 4D, a protection layer 170 may be formed to cover a sidewall of the lower electrode hole 164, whereas a bottom surface of the lower electrode hole 164 remains exposed. The protection layer 170 may be formed of a material having an etch selectivity with respect to the first and second mold layers 120 and 140 and a lower electrode 172 to be formed by a subsequent process. For example, the protection layer 170 may be formed of a silicon oxide layer, a silicon nitride layer, or a silicon oxynitride layer. A thickness of the protection layer 170 may be in a range of about 10 Å to about 50 Å. The protection layer 170 may be formed using a layer-formation technique with an improved step coverage property, e.g., a CVD process or an ALD process.

A lower electrode 172 may be formed to fill the lower electrode hole 164. The lower electrode 172 may be disposed on the lower structure 100 of the cell region CR. In example embodiments, a lower electrode layer may be formed on the lower structure 100 to fill the lower electrode hole 164. To form the lower electrode layer in the lower electrode hole 164 having a relatively high aspect ratio, the lower electrode layer may be formed using a layer-formation technique with an improved step coverage property, e.g., a CVD process or an ALD process. The lower electrode layer may be planarized until a top surface of the mask structure 160 is exposed, thereby forming the lower electrode 172 in the lower electrode hole 164. The planarization process of the lower electrode layer may be performed using a chemical mechanical polishing (CMP) process or an etch-back process.

The lower electrode 172 may include at least one of a metal material, a metal nitride, or a metal silicide. In example embodiments, the lower electrode 172 may be formed of a refractory metal material, e.g., cobalt, titanium, nickel, tungsten, and/or molybdenum. In other embodiments, the lower electrode 172 may be formed of the metal nitride, e.g., titanium nitride (TiN), titanium-silicon nitride (TiSiN), titanium-aluminum nitride (TiAlN), tantalum nitride (TaN), tantalum-aluminum nitride (TaAlN), and/or tungsten nitride (WN). In still other embodiments, the lower electrode 172 may be formed of a noble metal, e.g., platinum (Pt), ruthenium (Ru), and/or iridium (Ir). In yet other embodiments, the lower electrode 172 may be formed of at least one of a noble metal conductive oxide (e.g., PtO, $RuO_2$, and/or $IrO_2$) and/or a conductive oxide (e.g., $SrRuO_3$ (SRO), $(Ba,Sr)RuO_3$ (BSRO), $CaRuO_3$ (CRO), and/or LSCo).

Figure 4E:
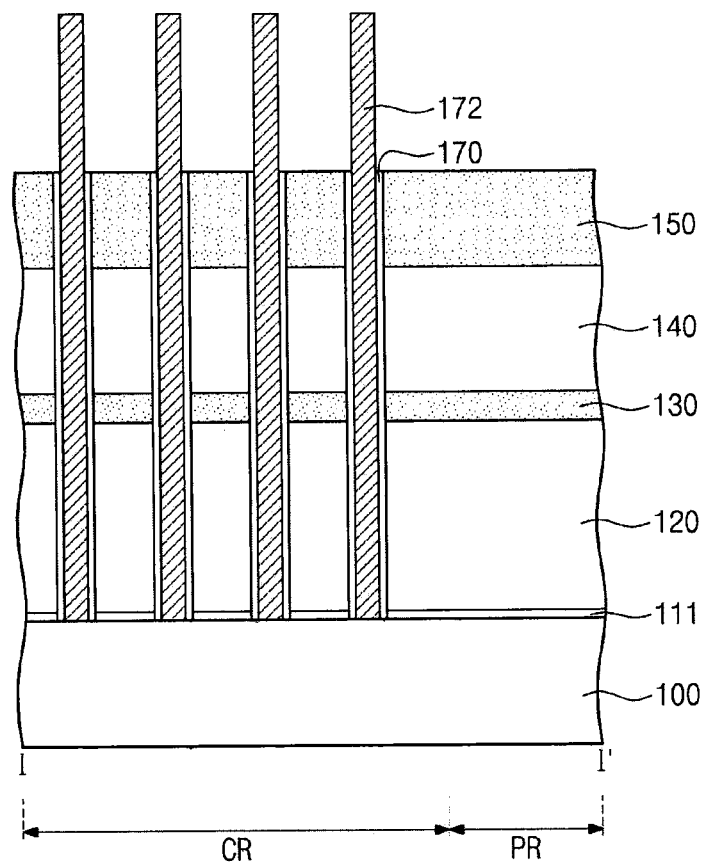

Referring to FIG. 4E, the mask structure 160 may be removed to expose a top surface of the second support pattern 150. A portion of the protection layer 170 adjacent to the mask structure 160 may be removed together with the mask structure 160. The mask structure 160 may be removed by a dry etching process. In this case, the mask structure 160 may be removed using a fluorine-based gas (e.g., CF4, CF4/O2, SF6, C2F6/O2, or NF3).

An upper portion of the second support layer 150 may be etched during the removal of the mask structure 160, so the thickness of the second support layer 150 may be reduced.

Figure 4F:
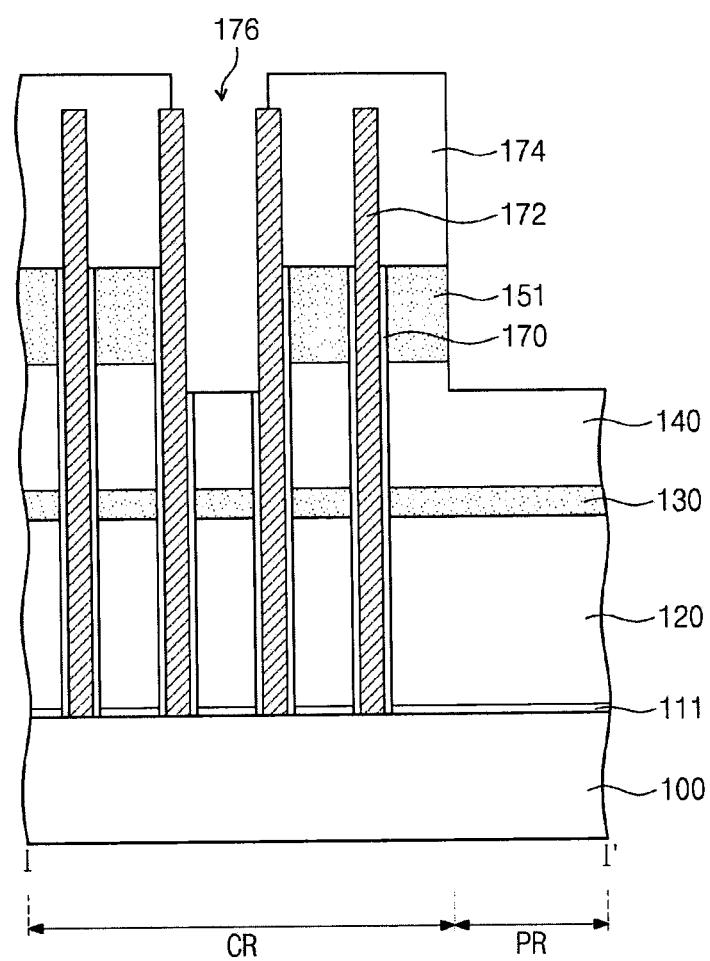

Referring to FIG. 4F, a mask pattern 174 exposing a portion of the second support layer 150 may be formed on the second support layer 150. The second support layer 150 may be etched using the mask pattern 174 as an etch mask to form an opening 176 exposing the second mold layer 140. A second support pattern 151 may be formed simultaneously with the opening 176. The exposed portion of the second support layer 150 may be removed by an anisotropic etching process. The second support pattern 151 may be formed on a portion of a sidewall of the lower electrode 172 and may be in contact with a portion of a sidewall of a neighboring lower electrode 172. Thus, the second support pattern 151 may support upper regions of a plurality of lower electrodes 172 adjacent to each other. When the second support layer 150 is etched, a top surface of the second mold layer 140 under the opening 176 may be recessed by over-etching.

The second support layer 150 and an upper portion of the second mold layer 140 which are disposed in the peripheral circuit region PR and are exposed by the mask pattern 174 may also be removed during the formation of the second support pattern 151 and the opening 176.

Figure 4G:
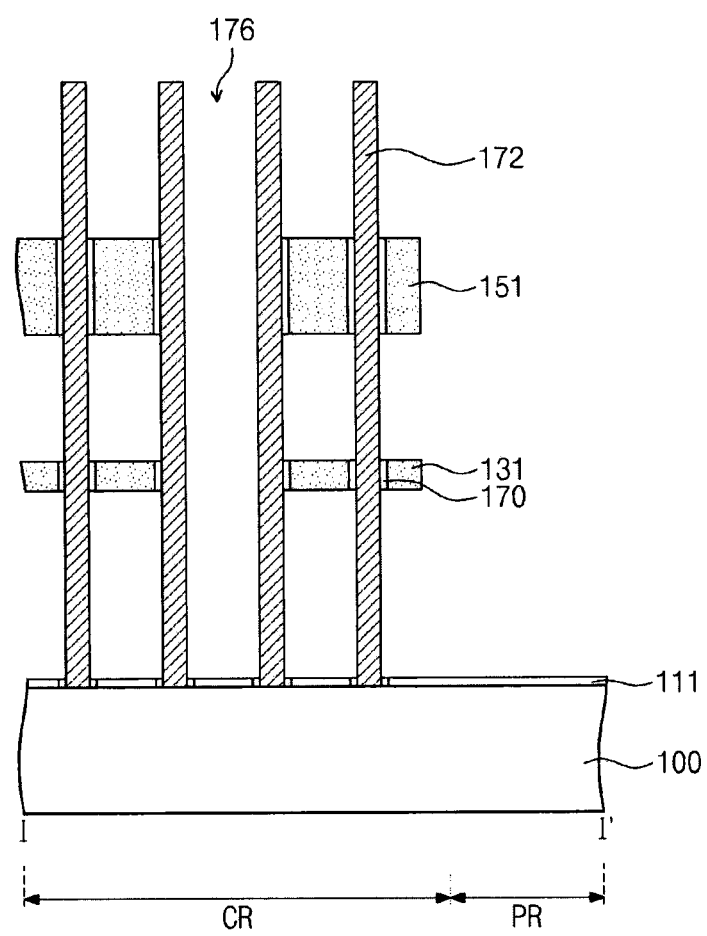

Referring to FIG. 4G, the mask pattern 174 may be removed after the formation of the opening 176. The second mold layer 140, the first support layer 130, and the first mold layer 120 may be sequentially etched through the opening 176. In detail, an etchant having an etch selectivity with respect to the second support pattern 151 may be provided into the opening 176 to completely remove the second mold layer 140. If the second mold layer 140 is formed of a silicon oxide layer, the second mold layer 140 may be removed by a wet etching process using an etchant including hydrofluoric acid. In example embodiments, if the second mold layer 140 is formed of a silicon nitride layer, the second mold layer 140 may be removed by a wet etching process using an etchant including phosphoric acid.

After the removal of the second mold layer 140, a portion of the first support layer 130 exposed by the opening 176 may be removed to form a first support pattern 131. The first support pattern 131 may be formed on a portion of the sidewall of the lower electrode 172 and may be in contact with a portion of the sidewall of the neighboring lower electrode 172. Thus, the first support pattern 131 may support lower regions of a plurality of lower electrodes 172 adjacent to each other. The portion of the first support layer 130 may be removed by an anisotropic etching process. A portion of the protection layer 170 exposed during the removal of the portion of the first support layer 130 may also be etched and an upper portion of the first mold layer 120 may be removed by over-etching.

The first mold layer 120 exposed by the first support pattern 131 may be removed by an etchant having an etch selectivity with respect to the second and first support patterns 151 and 131. The etchant solution may be provided through the opening 176 to completely remove the first mold layer 120. Since the first mold layer 120 is formed of the same material as the second mold layer 140, the etchant and the etching method for the removal of the first mold layer 120 may be the same as those for the removal of the second mold layer 140. The first and second mold layers 120 and 140 may be removed to expose the etch stop pattern 111.

The protection layer 170 exposed by the first and second support patterns 131 and 151 may be removed when the first and second mold layers 120 and 140 are removed. Thus, portions of the sidewall of the lower electrode 172, which are not covered by the first and second support patterns 131 and 151, may be exposed.

The second mold layer 140, the first support layer 130, and the first mold layer 120, which are formed on the lower structure 100 of the peripheral circuit region PR, may be completely removed, so the etch stop pattern 111 disposed in the peripheral circuit region PR may be exposed.

Figure 4H:
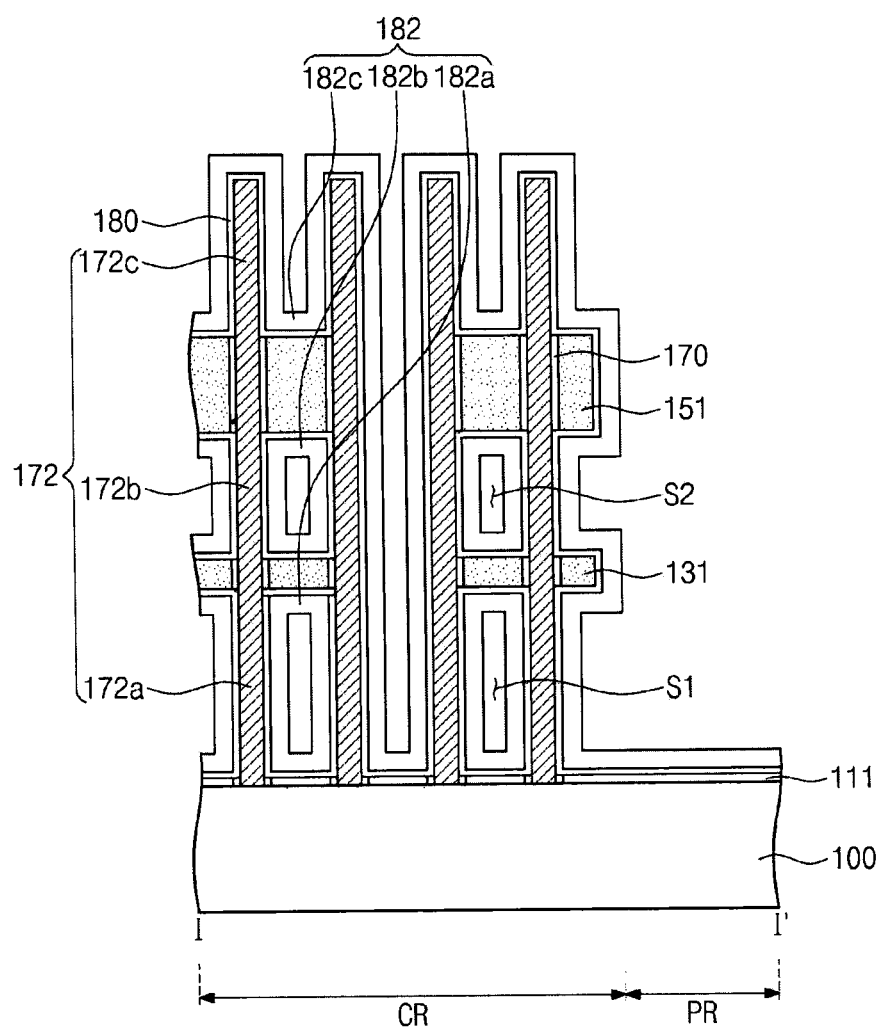

Referring to FIG. 4H, the lower electrode 172 may include a first lower electrode part 172a, a second lower electrode part 172b, and a third lower electrode part 172c. The first lower electrode part 172a may be defined as a portion of the lower electrode 172 positioned below the first support pattern 131. The second lower electrode part 172b may be defined as a portion of the lower electrode 172 positioned between the first support pattern 131 and the second support pattern 151. The third lower electrode part 172c may be defined as a portion of the lower electrode 172 positioned on the second support pattern 151. A dielectric layer 180 may be formed to conformally cover surfaces of the first and second support patterns 131 and 151, surfaces of the lower electrodes 172, and a top surface of the etch stop pattern 111. The dielectric layer 180 may also cover the top surface of the etch stop pattern 111 formed in the peripheral circuit region PR. In example embodiments, a dielectric material may be provided through the opening 176 to form the dielectric layer 180. The dielectric layer 180 may be formed using a layer-formation technique with an improved step coverage property, e.g., a CVD process or an ALD process.

For example, the dielectric layer 180 may be formed of a single or multi-layer. The dielectric layer 180 may include at least one of a metal oxide (e.g., $HfO_2$, $ZrO_2$, $Al_2O_3$, $La_2O_3$, $Ta_2O_3$, and/or $TiO_2$) and/or a perovskite-based dielectric material (e.g., $SrTiO_3$ (STO), $(Ba,Sr)TiO_3$ (BST), $BaTiO_3$, PZT, and/or PLZT). A thickness of the dielectric layer 180 may be in a range of about 50 Å to about 150 Å.

An upper electrode 182 may be formed on the dielectric layer 180. The upper electrode 182 may conformally cover the dielectric layer 180. The upper electrode 182 may include a first upper electrode part 182a, a second upper electrode part 182b, and a third upper electrode part 182c. The first upper electrode part 182a may be defined as a portion of the upper electrode 182 positioned below the first support pattern 131. The second upper electrode part 182b may be defined as a portion of the upper electrode 182 positioned between the first support pattern 131 and the second support pattern 151. The third upper electrode part 182c may be defined as a portion of the upper electrode 182 positioned on the second support pattern 151. In more detail, the first upper electrode part 182a may cover the top surface of the lower structure 100, a sidewall of the first lower electrode part 172a, and a bottom surface of the first support pattern 131. The second upper electrode part 182b may cover a top surface of the first support pattern 131, a bottom surface of the second support pattern 151, and a sidewall of the second lower electrode part 172b. The third upper electrode 182c may cover a sidewall of the third lower electrode part 172c and a top surface of the second support pattern 151.

A first space S1 may be defined by the lower structure 100, the first support pattern 131, and the first lower electrode 172a disposed under the first support pattern 131. The first space S1 may not be completely filled with the upper electrode 182. Thus, the first space S1 may be surrounded by the first upper electrode 182a. A second space S2 may be defined by the first and second support patterns 131 and 151 and the second lower electrode 172b disposed between the first and second support patterns 131 and 151. The second space S2 may not be completely filled with the upper electrode 182, so the second space S2 may be surrounded by the second upper electrode 182b. The upper electrode 182 may cover an inner sidewall of the opening 176, and the opening 176 may not be completely filled with the upper electrode 182.

The upper electrode 182 may be formed using a layer-formation technique with an improved step coverage property, e.g., a CVD process or an ALD process. The upper electrode 182 may include at least one of a semiconductor material doped with dopants, a metal material, a metal nitride, and/or a metal silicide. For example, the upper electrode 182 may include at least one of a refractory metal (e.g., cobalt, titanium, nickel, tungsten, and/or molybdenum), a metal nitride (e.g., titanium nitride (TiN), titanium-aluminum nitride (TiAlN), and/or tungsten nitride (WN)), or a noble metal (e.g., platinum (Pt), ruthenium (Ru), and/or iridium (Ir)). The upper electrode 182 may have a tensile stress characteristic.

Referring again to FIG. 2A, a barrier layer 184 may be formed on the upper electrode 182. The barrier layer 184 in the cell region CR may cover the upper electrode 182 disposed on a top surface of the lower electrode 172.

A third space S3 may be formed on the second support pattern 151. The third space S3 may be defined by the second support pattern 151, the third lower electrode part 172c disposed over the second support pattern 151, and the barrier layer 184. The third space S3 may not be completely filled with the upper electrode 182 and the barrier layer 184. Thus, the third space S3 may be surrounded by the third upper electrode part 182c and the barrier layer 184.

The barrier layer 184 may cover an upper region of the opening 176 to form a fourth space S4 on the lower structure 100. The fourth space S4 may be defined by the barrier layer 184 and the upper electrode 182 covering the inner sidewall of the opening 176. The fourth space S4 may not be completely filled with the barrier layer 184.

Referring again to FIGS. 2A and 2B, the barrier layer 184 may be in contact with the upper electrode 182 covering sidewalls of the first and second support patterns 131 and 151 adjacent to the peripheral circuit region PR. In addition, the barrier layer 184 may cover the lower structure 100 of the peripheral circuit region PR. The barrier layer 184 formed on the lower structure 100 of the cell region CR adjacent to the peripheral circuit region PR may form a fifth space S5 and a sixth space S6. The fifth space S5 may be surrounded by the first upper electrode part 182a and the barrier layer 184. The first upper electrode part 182a surrounding the fifth space S5 may include a first top portion T1 disposed on the bottom surface of the first support pattern 131, a first vertical portion V1 disposed on the sidewall of the first lower electrode part 172a, and a first bottom portion B1 disposed on the top surface of the lower structure 100. The first vertical portion V1 of the first upper electrode part 182a may be spaced apart from the barrier layer 184 with the fifth space S5 interposed therebetween.

The sixth space S6 may be surrounded by the second upper electrode part 182b and the barrier layer 184. The second upper electrode part 182b surrounding the sixth space S6 may include a second top portion T2 disposed on the bottom surface of the second support pattern 151, a second vertical portion V2 disposed on the sidewall of the second lower electrode 172b, and a second bottom portion B2 disposed on the top surface of the first support pattern 131. The second vertical portion V2 of the second upper electrode 182b may be spaced apart from the barrier layer 184 with the sixth space S6 interposed therebetween.

The barrier layer 184 may be formed by a PVD process. The barrier layer 184 may be formed of the same material as the upper electrode 182. For example, the barrier layer 184 may include a metal nitride layer (e.g., a titanium nitride (TiN) layer). In example embodiments, the barrier layer 184 may be at least one of titanium (Ti), tungsten (W), tungsten nitride (WN), ruthenium (Ru), molybdenum nitride (MoN), aluminum nitride (AlN), an/or tantalum nitride (TaN). The barrier layer 184 may have a compressive stress characteristic.

A capping layer 186 may be formed on the barrier layer 184. The capping layer 186 may cover a top surface of the barrier layer 184. For example, the capping layer 186 may be formed of silicon-germanium (SiGe) doped with boron. In other words, the capping layer 186 may be formed using a source gas including silicon, a source gas including germanium, and a source gas including boron. In addition, the capping layer 186 including the SiGe doped with boron may be formed at a process temperature of about 300° C. to about 430° C. A silicon content of the SiGe may be in a range of about 30% to about 60%. The capping layer 186 may function as a buffer layer that is used to realize a desirable electrical contact between a wide metal contact (not shown) and the capacitors having a relatively small area. A portion of the capping layer 186, which is in contact with the metal contact, may be etched when the metal contact is formed on the capping layer 186.

Generally, a capping layer may be formed directly on an upper electrode. In this case, silicon atoms included in source gases used for forming the capping layer may react with materials of the upper electrode to form an impurity layer (e.g., a TiSiN layer). The impurity layer may reduce a work function value of a portion of the upper electrode, so a characteristic of a capacitor may be deteriorated. In addition, chlorine ions included in the source gases used for forming the capping layer may etch the upper electrode. Thus, the characteristic of the capacitor may be more deteriorated.

However, according to embodiments of the inventive concepts, since the barrier layer 184 is formed on the upper electrode 182, it is possible to prevent or inhibit chlorine ions from reacting directly with the upper electrode 182. In addition, since the upper electrode 182 has the tensile stress characteristic and the barrier layer 184 has the compressive stress characteristic, the barrier layer 184 may relax the stress characteristic of the upper electrode 182. Furthermore, since the barrier layer 184 is formed on an upper portion of the upper electrode 182, the barrier layer 184 may have a substantially flat top surface. Thus, the capping layer 184 formed on the barrier layer 184 may have substantially flat.

According to the example embodiments of the inventive concepts, as illustrated in FIG. 3, the middle layer 188 may be formed on the barrier layer 184 by silicon atoms. In example embodiments, the middle layer 188 may correspond to the impurity layer (e.g., the TiSiN layer) described above. The middle layer 188 is not in contact with the upper electrode 182. In other words, an upper portion of the barrier layer 184 may be converted into the middle layer 188. Thus, the middle layer 188 does not influence a characteristic of the upper electrode 182.

The metal contact (not shown) may be formed on the capping layer 186. A portion of the capping layer 186 may be etched when the metal contact is formed.

Figure 5:
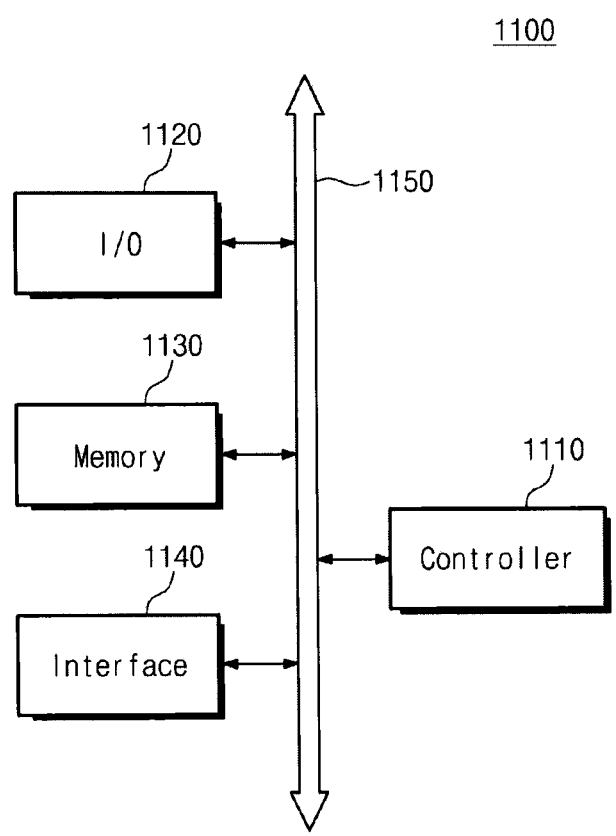
FIG. 5 is a schematic block diagram illustrating an electronic system including a semiconductor device according to example embodiments of the inventive concepts.

FIG. 5 is a schematic block diagram illustrating an electronic system including a semiconductor device according to example embodiments of the inventive concepts.

Referring to FIG. 5, an electronic system 1100 according to example embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include the semiconductor device according to embodiments of the inventive concepts.

The controller 1110 may include at least one of a microprocessor, a digital signal processor, a microcontroller, or another logic device having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast dynamic random access memory (DRAM) device and/or a fast static random access memory (SRAM) device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 6:
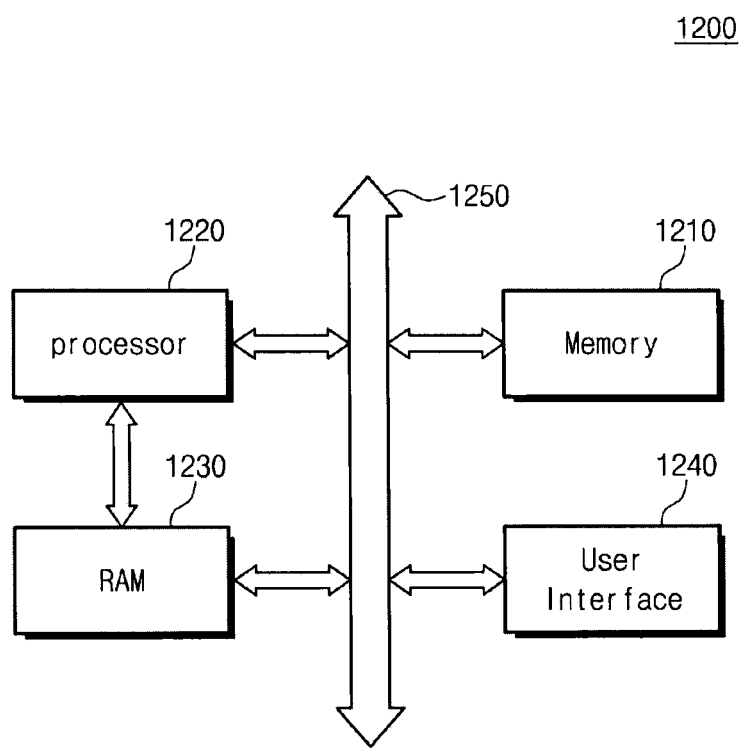
FIG. 6 is a schematic block diagram illustrating an electronic system including a semiconductor device according to example embodiments of the inventive concepts.

FIG. 6 is a schematic block diagram illustrating an electronic system including a semiconductor device according to example embodiments of the inventive concepts.

Referring to FIG. 6, an electronic system 1200 may include at least one of the semiconductor devices according to example embodiments of the inventive concepts. The electronic system 1200 may include a mobile device or a computer. For example, the electronic system 1200 may include a memory system 1210, a processor 1220, a RAM device 1230, and a user interface unit 1240 which may communicate with each other through the data bus 1250. The processor 1220 may execute program operations and may control the electronic system 1200. The RAM device 1230 may be used as a working memory of the processor 1220. For example, each of the processor 1220 and the RAM device 1230 may include the semiconductor device according to embodiments of the inventive concepts. Alternatively, the processor 1220 and the RAM device 1230 may be included in one package. The user interface unit 1240 may be used to input or output data to or from the electronic system 1200. The memory system 1210 may store codes used for operating the processor 1220, data processed by the processor 1220, and/or data inputted from an external system. The memory system 1210 may include a controller and a memory device.

The electronic system 1200 may be realized as a mobile system, a personal computer, an industrial computer, or a logic system performing various functions. The mobile system may be one of a PDA, a portable computer, a web tablet, a wireless phone, a mobile phone, a laptop computer, a memory card, a digital music player, or a data transmitting/receiving system. If the electronic system 1200 is an apparatus capable of performing wireless communication, the electronic device 1300 may be used in a communication interface protocol of a communication system, e.g., CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, or MMDS.

According to example embodiments of the inventive concepts, the barrier layer may be formed on the upper electrode. Thus, it is possible to prevent or inhibit chlorine ions included in the source gas used for forming the capping layer from reacting directly with the upper electrode.

According to example embodiments of the inventive concepts, the middle layer may be formed on the barrier layer by silicon atoms generated during the formation of the capping layer. The middle layer is not in contact with the upper electrode. In other words, the upper portion of the barrier layer may be converted into the middle layer. Thus, the middle layer may not influence the characteristic of the upper electrode.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a lower electrode on a lower structure;
   a support pattern on a portion of a sidewall of the lower electrode;
   a dielectric layer conformally covering a surface of the lower electrode;
   an upper electrode conformally covering a surface of the dielectric layer; and
   a barrier layer on the upper electrode,
   wherein the barrier layer and the upper electrode define a space on the sidewall of the lower electrode.

2. The semiconductor device of claim 1, further comprising:
   a capping layer covering the barrier layer on the lower structure.

3. The semiconductor device of claim 2, further comprising:
   a middle layer between the barrier layer and the capping layer, the middle layer including a titanium-silicon nitride (TiSiN) layer.

4. The semiconductor device of claim 1, wherein
   the upper electrode and the barrier layer include a same material,
   the upper electrode has a tensile stress, and
   the barrier layer has a compressive stress.

5. The semiconductor device of claim 1, wherein the barrier layer is a titanium nitride layer.

6. A semiconductor device comprising:
   a lower electrode on a lower structure;
   a first support pattern on a first sidewall of the lower electrode;
   a dielectric layer conformally covering the lower electrode and the first support pattern;

an upper electrode conformally covering the dielectric layer; and a barrier layer on the upper electrode to cover a top surface of the lower electrode, wherein the first support pattern, the first sidewall of the lower electrode, and the lower structure define a first space under the first support pattern and surrounded by the upper electrode.

7. The semiconductor device of claim 6, wherein the lower electrode includes,
   a first lower electrode part below the first support pattern, and
   a second lower electrode part above the first support pattern; and
the upper electrode includes,
   a first upper electrode part covering the first lower electrode part, and
   a second upper electrode part covering the second lower electrode part.

8. The semiconductor device of claim 7, wherein the barrier layer contacts a portion of the upper electrode covering a sidewall of the first support pattern and extends onto a top surface of the lower structure.

9. The semiconductor device of claim 8, wherein the first upper electrode part includes a first vertical portion covering a sidewall of the first lower electrode part, a first top portion under the first support pattern and a first bottom portion on the lower structure, and
the first vertical portion, the first top portion, the first bottom portion and the barrier layer define a second space.

10. The semiconductor device of claim 8, wherein the first support pattern, the second lower electrode part, and the barrier layer define a third space on the first support pattern, and
the upper electrode and the barrier layer surround the third space.

11. The semiconductor device of claim 10, wherein the second upper electrode part includes a second vertical portion covering a sidewall of the second lower electrode part, a second top portion under a second support portion and a second bottom portion on the first support pattern, and the second vertical portion, the second top portion, the second bottom portion and the barrier layer define the third space.

12. The semiconductor device of claim 6, wherein
a second sidewall of the lower electrode, the lower structure, and the barrier layer define a fourth space on the lower structure, and
the upper electrode and the barrier layer surround the fourth space.

13. The semiconductor device of claim 8, wherein
the lower structure includes a cell region and a peripheral circuit region,
the lower electrode, the dielectric layer, the upper electrode, and the barrier layer are sequentially stacked on the lower structure of the cell region, and
the barrier layer extends onto the top surface of and covers the lower structure of the peripheral circuit region.

14. The semiconductor device of claim 6, wherein
the upper electrode and the barrier layer include a same material,
the upper electrode has a tensile stress, and
the barrier layer has a compressive stress.

15. A semiconductor device comprising:
a lower electrode on a lower structure;
a support pattern on a portion of a sidewall of the lower electrode
a dielectric layer on the lower electrode;
an upper electrode on the dielectric layer; and
a barrier layer on the upper electrode, the barrier layer having an uppermost portion including titanium-silicon nitride (TiSiN).

16. The semiconductor device of claim 15, further comprising:
a capping layer covering the barrier layer.

17. The semiconductor device of claim 15, wherein
the upper electrode and the barrier layer include a same material,
the upper electrode has a tensile stress, and
the barrier layer has a compressive stress.

18. The semiconductor device of claim 15, wherein a lower portion of the barrier layer includes titanium nitride.

* * * * *